US 6,710,239 B2

(12) United States Patent
Tanaka

(10) Patent No.: US 6,710,239 B2
(45) Date of Patent: Mar. 23, 2004

(54) SOLAR CELL, INTERCONNECTOR FOR SOLAR CELL, AND SOLAR CELL STRING

(75) Inventor: Satoshi Tanaka, Yamatotakada (JP)

(73) Assignee: Sharp Kabushiki Kaisha, Osaka (JP)

(*) Notice: Subject to any disclaimer, the term of this patent is extended or adjusted under 35 U.S.C. 154(b) by 180 days.

(21) Appl. No.: 10/038,681

(22) Filed: Jan. 8, 2002

(65) Prior Publication Data

US 2002/0148499 A1 Oct. 17, 2002

(30) Foreign Application Priority Data

Jan. 19, 2001 (JP) ........................................ 2001-011603

(51) Int. Cl.[7] ............................................. H01L 31/05
(52) U.S. Cl. ....................... 136/244; 136/256; 428/615; 428/646; 428/655; 428/673; 439/500; 174/260; 174/263; 438/98
(58) Field of Search ................... 136/244, 256; 428/615, 646, 655, 673; 439/500; 174/260, 263; 438/98

(56) References Cited

U.S. PATENT DOCUMENTS

| 3,982,265 | A | * | 9/1976 | Johnston, Jr. ................ 136/256 |
| 5,178,685 | A | * | 1/1993 | Borenstein et al. .......... 136/244 |
| 5,320,272 | A | | 6/1994 | Melton et al. .......... 228/180.21 |
| 5,328,520 | A | * | 7/1994 | Itagaki ........................ 136/256 |
| 5,569,433 | A | * | 10/1996 | Chen et al. .................. 420/557 |

OTHER PUBLICATIONS

Hu et al, Solar Cells from Basic to Advanced Systems, McGraw–Hill Book Company (1983), pp. 81–85.*
Rosenblum et al, "ISO 14000 Introduction in the Photovoltaic Industry," Conference Record of the 28th Photovoltaic Specialists Conference, Sep. 15–22, 2000, pp. 1476–1478.*

* cited by examiner

Primary Examiner—Alan Diamond
(74) Attorney, Agent, or Firm—Nixon & Vanderhye P.C.

(57) ABSTRACT

A solar cell includes electrodes coated with lead-free solder. This solar cell can provide satisfactory output characteristics and also does not cause lead pollution.

14 Claims, 2 Drawing Sheets

US 6,710,239 B2

SOLAR CELL, INTERCONNECTOR FOR SOLAR CELL, AND SOLAR CELL STRING

BACKGROUND OF THE INVENTION

1. Field of the Invention

The present invention relates to solar cells and particularly to an improvement in solder coating of electrodes included in the same.

2. Description of the Related Art

An exemplary solar cell including electrodes conventionally coated with solder is schematically shown in cross section in FIG. 1. In the figures of the present application, like portions are denoted by like reference numerals.

The FIG. 1 solar cell includes an etched p-type silicon substrate 1 having a light receiving side with an n-type diffusion layer 2. On n-type diffusion layer 2 an anti-reflection film 3 is provided to reduce surface reflectance. P-type silicon substrate 1 has a back surface provided with a back surface aluminum electrode 4. Back surface aluminum electrode 4 and anti-reflection film 3 on the light receiving side are provided thereon with silver electrodes 5 and 6 coated with solder layers 7.

Such a solar cell is fabricated by such a method as represented in a flow chart of FIG. 2. More specifically, in a case of using a crystalline silicon substrate, p-type silicon substrate 1 is initially etched at step S1. At step S2, p-type silicon substrate 1 is provided on its light receiving side with n-type diffusion layer 2 and thereon is provided anti-reflection film 3 to reduce surface reflectance.

At step S3, p-type silicon substrate 1 has its back surface almost entirely screen-printed with aluminum paste. The printed aluminum paste is dried and fired in an oxidizing atmosphere to form back surface aluminum electrode 4.

At steps S4 and S5, silver paste is screen-printed on back surface aluminum electrode 4 and anti-reflection film 3 in patterns and then dried. The dried silver paste is fired in an oxidizing atmosphere to form silver electrodes 5 and 6. That is, silver electrodes 5 and 6 can be formed by simultaneous baking (step S6).

At step S7, substrate 1 is immersed in an activator-containing flux at a normal temperature for several tens seconds to provide silver electrodes 5 and 6 with the flux. Then, substrate 1 is exposed to hot air and thus dried.

At step S8, substrate 1 is immersed in a 6:4 eutectic solder bath (of about 195° C.) containing 2 mass % silver for about one minute to coat silver electrodes 5, 6 with solder layers 7.

At step S9, substrate 1 is ultrasonically washed several times in normal or hot water and it is then rinsed with pure water and finally exposed to hot air and thus dried. A conventional solar cell is thus obtained.

FIG. 3 shows a solar cell string including a plurality of conventional solar cells thus fabricated and interconnected. In this conventional string, a solar cell 10 has a main surface electrode 11 coated with 6:4 solder and a plurality of such solar cells 10 are connected by interconnectors 12 coated with 6:4 solder. Such a string is fabricated in such a method as follows. Interconnector 12 including a copper core line coated with 6:4 eutectic solder is superposed on main electrode 11 of solar cell 10 and exposed to blowing hot air of about 400° C. to melt the solder. The solder is then cooled and thus solidifies to provide the connection. Such a connection process is repeated for the plurality of solar cells on their front and back sides to provide a cell string. The string thus completed is used to fabricate a solar cell module.

In recent years, lead harmful to human body causes issues from an environmental view point and thus various electronic devices free of lead are increasingly developed. Fabrication of solar cells free of lead is also demanded in the industry of interest.

In the past, however, a solar cell using lead-free solder has not been produced. For example, if a conventional 6:4 eutectic solder bath is replaced with a Sn bath to coat with Sn an electrode formed of fired silver paste, the silver contained in the electrode would be taken into the Sn bath and the electrode would disappear in some locations and the product would not function as a solar cell. This is probably attributed to the fact that Sn has a melting point of 231.9° C., about 50° C. higher than that (i.e., 183° C.) of 6:4 eutectic solder.

U.S. Pat. No. 5,320,272 discloses an example of lead-free solder, which, however, is used for semiconductor integrated circuits.

SUMMARY OF THE INVENTION

In view of the above-described prior art, an object of the present invention is to provide a solar cell having good output properties without causing lead pollution. Another object of the present invention is to provide an interconnector which does not cause lead pollution and then provide a reliable solar cell string connected by such interconnectors.

A solar cell according to the present invention is characterized in that it has electrodes coated with lead-free solder.

The electrode itself can be formed by baking matal paste. Furthermore, the electrode may be formed by metal vapor deposition, spattering, or plating.

The lead-free solder can preferably be Sn—Bi—Ag-based solder or Sn—Ag-based solder.

The electrode is preferably formed from matal paste containing powdery silver, powdery glass, an organic vehicle, an organic solvent, phosphorus oxide, and halide.

The solar cell's electrode receives flux including resin, a solvent, and a resin stabilizer, before it is coated with lead-free solder.

An interconnector for the solar cell according to the present invention is characterized in that it is coated with lead-free solder.

A solar cell string according to the present invention is characterized in that a plurality of the solar cells having the electrodes coated with the lead-free solder are interconnected by the interconnectors coated with the lead-free solder.

The lead-free solder used for the solar cell and that used for the interconnector can be identical in composition.

At least one of the lead-free solder for the solar cell and that for the interconnector can contain Bi preferably at 3 to 89 mass %.

At least one of the lead-free solder for the solar cell and that for the interconnector may contain Ag preferably at 3.5 to 4.5 mass %.

In the solar cell according to the present invention, the electrodes can be protected from mechanical shock and moisture in the ambient by coating the electrodes with the lead-free solder which does not cause lead pollution. Coating the electrodes with the lead-free solder facilitates formation of the solar cell string by interconnecting the plurality of the solar cells with the interconnectors.

FIG. 4 is a schematic cross section of an example of a solar cell according to the present invention. The FIG. 4 solar cell is different from the FIG. 1 conventional solar cell only in that electrodes are coated with different solder layers. More specifically, the present solar cell uses lead-free solder layers 8, rather than conventional 6:4 eutectic solder layers.

The lead-free solder can be Sn—Bi—Ag-based solder or Sn—Ag-based solder. Sn—Bi—Ag-based solder and Sn—Ag-based solder each have a melting point lower than Sn. Herein, Sn—Bi—Ag-based solder contains no less than 0.1 mass % Ag. Sn—Ag-based solder also contains no less than 0.1 mass % Ag.

To carry out the solder dip process without causing problems, it is desirable to use a conventional dip temperature of about 195° C. and it is necessary that the dip temperature is no more than 225° C. which is a practical limit in view of solar cell characteristics and reliability. To have a melting point of no more than 225° C., Sn—Bi—Ag-based solder containing 0.1 mass % Ag should contain 5 to 88 mass % Bi and that containing 1.3 mass % Ag should contain 3 to 89 mass % Bi. To have a melting point of no more than 195° C., Sn—Bi—Ag-based solder containing 0.1 mass % Ag should contain 27 to 79 mass % Bi and that containing 1.8 mass % Ag should contain 35 to 60 mass % Bi. Thus, Sn—Bi—Ag-based solder containing 3 to 89 mass % Bi is preferable and that containing 35 to 60 mass % Bi is more preferable.

Similarly, Sn—Ag-based solder having a melting point of no more than 225° C. should contain 3.5 to 4.5 mass % Ag. However, there does not exist Sn—Ag-based solder having a melting point of no more than 195° C. Thus, Sn—Ag-based solder containing 3.5 to 4.5 mass % Ag is preferable.

The solar cell's electrode can be formed from silver paste containing powdery silver, powdery glass, an organic vehicle and an organic solvent as main components and also containing iridium chloride and phosphorous oxide. Furthermore, to coat the solar cell electrode with lead-free solder, a flux material can be used which contains a polyalkylglycol-type resin and a solvent and does not contain any activator. More specifically, a flux containing a resin, a solvent and a resin stabilizer can be used to clean the electrode before lead-free solder is used to coat the electrode.

The solar cell electrode can be formed of matal paste fired and it can alternatively be formed by metal vapor deposition, spattering or plating.

The present interconnector for the solar cell is coated with lead-free solder.

In the present solar cell string, a plurality of solar cells each having electrodes coated with lead-free solder are interconnected by interconnectors each including a metal core line coated with lead-free solder.

FIG. 5 schematically shows a solar cell string of the present invention. In this string, a solar cell 10 has a main surface electrode 21 coated with lead-free solder and a plurality of such solar cells 10 are connected by interconnectors 22 each including a metal core line coated with lead-free solder. Herein, if the lead-free solder used for the solar cell and that used for the interconnector are identical in composition, the product can be fabricated in a simplified and stabilized process. If the lead-free solder for the solar cell and that for the interconnector are different in composition, they have their respective different melting points and thus the soldering process requires precise temperature adjustment.

By introducing Ag into at least one of the lead-free solder for the solar cell and that for the interconnector, the following effect can be obtained. By introducing Ag into the lead-free solder for the solar cell, it becomes possible to significantly delay elusion of Ag contained in the solar cell electrode of Ag paste fired. On the other hand, even if the solder for the solar cell electrode does not contain Ag, it becomes possible by introducing Ag into the lead-free solder for the interconnector to reduce elusion of Ag from the electrode of fired Ag paste in the soldering process.

Furthermore, if at least one of the lead-free solder for the solar cell and that for the interconnector contains Bi, the solar cell electrode and the interconnector's metal core line can be connected together without reducing the melting point of the other lead-free solder. Herein, at least one of the lead-free solder preferably contains 3 to 89 mass % Bi, more preferably 35 to 60 mass % Bi. Similarly, at least one of the lead-free solder for the solder cell and that for the interconnector is Sn—Ag-based solder, it preferably contains 3.5 to 4.5 mass % Ag.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
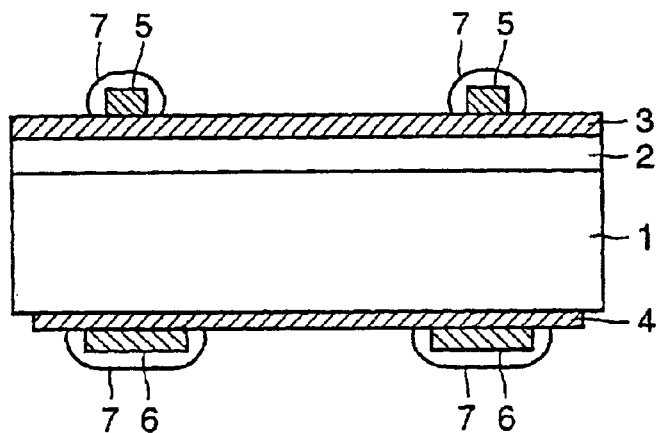
FIG. 1 is a schematic cross section of a conventional solar cell.
Figure 2:
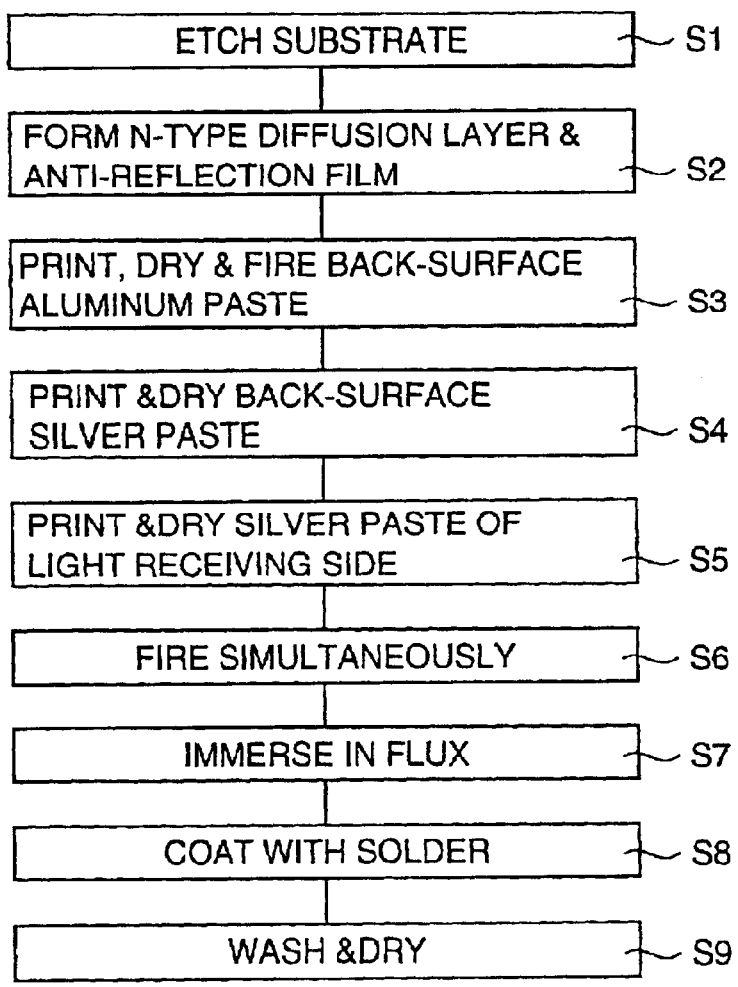
FIG. 2 is a flow chart for illustrating a process for fabricating a solar cell.
Figure 3:
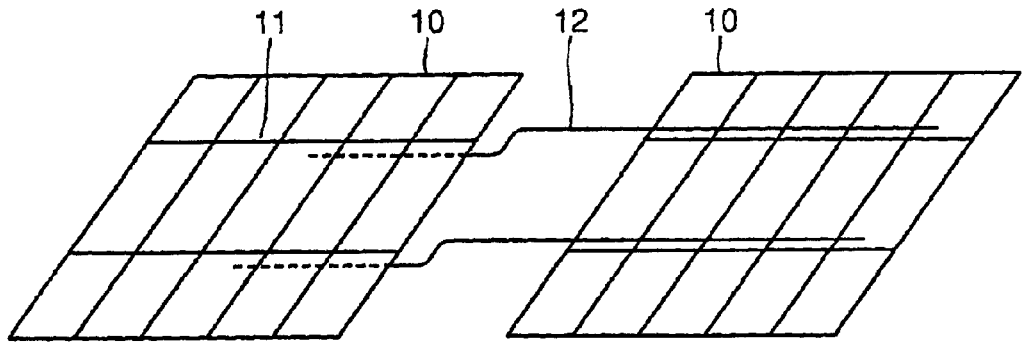
FIG. 3 is a schematic perspective view for illustrating a conventional solar cell string.
Figure 4:
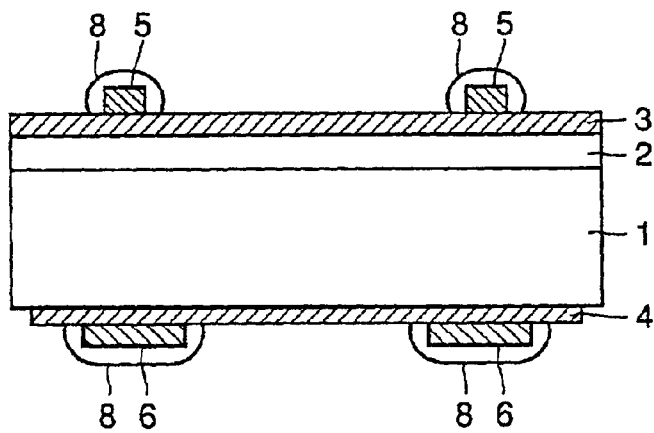
FIG. 4 is a schematic cross section of a solar cell of the present invention.

As shown in FIG. 4, a texture-etched (not shown specifically) p-type silicon substrate 1 had its light receiving side subjected to thermal diffusion of P to form an n-type diffusion layer 2 and thereon a silicon nitride film was formed as an anti-reflection film 3 through plasma chemical vapor deposition (plasma CVD). Substrate 1 had its back surface screen-printed with a commercially available aluminum paste and then dried at about 150° C. and thereafter fired in the air to form a back-surface aluminum electrode 4.

Then, a method of sintering silver paste, vapor deposition, spattering, or plating can be employed to form electrodes 5, 6 on silicon substrate 1.

Silver paste can be fired to form the electrode, as in the following procedure. Silver paste having composition as shown in Table 1 is printed in a pattern on the back surface of silicon substrate 1 to have a thickness of about 30 $\mu$m and it is then dried at 150° C. for about four minutes. Similarly, the silver paste is printed in a pattern on the light receiving side of silicon substrate 1 and dried. Then, the silver paste patterns are fired in an oxidizing atmosphere at 600° C. for two minutes to form electrodes 5, 6 on the front and back surfaces of silicon substrate 1.

TABLE 1

| Components | Ratio (mass %) |
|---|---|
| Silver powder | 79 |
| Glass frit | 2.5 |
| Organic vehicle | 7.5 |
| Phosphorous pentoxide | 0.1 |
| Solvent | 10.895 |
| Illidium chloride | 0.005 |

Vapor deposition can be employed to form the electrode, as in the following procedure. A resist layer is formed in a pattern which exposes an area where the electrode is to be formed on anti-reflectance film 3, and then HF is used with the resist pattern being used as a mask to partly etch the anti-reflection film away. After substrate 1 is washed and dried, Ti, Pd, and Ag layers are successively formed through vapor deposition to be 0.1 μm, 0.1 μm and 1 μm in thickness, respectively, at a substrate temperature of about 70° C. The resist is then removed and heat treatment is carried out at a substrate temperature of 350° C. in nitrogen to form the silver electrode. Note that spattering can also be employed to form the silver electrode, as in the procedure described for the vapor deposition.

Furthermore, plating can also be employed to form the electrode, as in the following procedure. A resist layer is formed in a pattern which exposes an area where the electrode is to be formed on anti-reflectance film 3, and then HF is used with the resist pattern being used as a mask to partly etch the anti-reflection film away. After pre-plating treatment is carried out, electroless-plated layers of Ni and Ag are formed to be 0.5 μm and 2.5 μm in thickness, respectively. The resist is then removed and heat treatment is carried out at a substrate temperature of 150° C. in nitrogen to form the silver electrode.

The solar cell with silver electrodes 5, 6 can be immersed into flux of composition of Table 2 and then exposed to hot air and thus dried and it can then be immersed into a led-free solder bath having composition of Table 3 to form solder layers 8. In doing so, the solder can contain a small amount of phosphorus, antimony, gallium, or the like to enhance wettability. The solar cell is then rinsed with pure water or hot pure water and dried and thus the solar cell is completed. In the meantime, while Table 3 shows Sn—Bi—Ag-based lead-free solder and Sn—Ag-based lead-free solder, either one of the solder can be used to cover electrodes 5, 6.

TABLE 2

| Components | Ratio (mass %) |
|---|---|
| Polyalkylglycol-type resin | 49.9 |
| Alcohol | 49.9 |
| Amine-type stabilizer | 0.2 |

TABLE 3

| Lead-free solder | Dip temperature (° C.) |
|---|---|
| Sn—Bi—Ag-based | 193 |
| Sn—Ag-based | 222 |

Solar cells thus fabricated had their characteristics examined and any cell having a fill factor (FF) of no more than 0.69 was judged to be defective. In a case that the fired silver paste is eaten in a solder bath, as conventional, i.e., silver in the fired silver paste is taken into the Sn bath and the electrode disappears at some locations and thus the product cannot be obtained as a complete solar cell, the fill factor has a significantly reduced value and the defectiveness can readily be judged. Table 4 shows a result of comparison with the case that a bath of Sn alone used as conventional. The electrodes were formed by methods of baking metal paste, vapor deposition, sputtering and plating. Regarding each method of forming the electrode, five samples of the solar cells were fabricated. In Table 4, both lead-free solders of Sn—Bi—Ag-based and Sn—Ag-based compositions were used to cover the electrodes in the present invention.

TABLE 4

| | | No. of cells defective in FF | | | |
|---|---|---|---|---|---|
| | Solder composition | Baking paste | Vapor deposition | Spattering | Plating |
| Present invention | Table 3 | 0/5 | 0/5 | 0/5 | 0/5 |
| Conventional method | Sn alone | 5/5 | 5/5 | 5/5 | 5/5 |

With the solder having either the Sn—Bi—Ag-based composition or the Sn—Ag-based composition, any solar cell was not judged from the FF value to be defective, whichever method was employed to form the electrode. With the solder having a composition of Sn alone, all of the five samples were judged from the FF value to be defective, whichever method was employed to form the electrode.

It can thus be understood that Sn—Bi—Ag- or Sn—Ag-based solder, having a melting point lower than Sn solder, can be used to satisfactorily coat the metal electrode formed by any method of baking matal paste, vapor deposition, spattering and plating.

In any method of baking metal paste, vapor deposition, sputtering and plating employed to form the electrode, copper etc. rather than silver can be used as a metal for an overlying layer. When plating, vapor deposition, or the like is employed, typically two or three types of metal layers are successively stacked, and the metal for the overlying layer means the outermost layer of the two or three types of metals. Furthermore, not only electroless plating but also electroplating can be used to form the electrode. Furthermore, since conventional soldering material can be simply changed to lead-free soldering material in the present invention, the present solar cell can be obtained without involving any complexity in a conventional solar cell fabrication procedure which is applicable to fabricating the present solar cell.

Second Embodiment

Various types of silver paste materials were used to examine how they affect lead-free soldering material. Silver paste containing powdery silver, powdery glass, an organic vehicle, an organic solvent, phosphorous oxide and halide was used as the silver paste in the present invention. More specifically, it was the silver paste as shown in Table 1. Commercially available silver paste (8050S of Du Pont Co,. Ltd.) was used as a comparative example. Solar cells were fabricated by a procedure similar to that described in the first embodiment. Evaluation of the obtained solar cells was carried out based on the FF value similarly as in the first embodiment. For each case, five samples were made and their results were shown in Table 5.

TABLE 5

|  | Solder composition | No. of cells defective in FF | |
|---|---|---|---|
|  |  | Silver paste of TABLE 1 | Commercially available silver paste |
| Present invention | Table 3 | 0/5 | 5/5 |
| Conventional method | Sn alone | 5/5 | 5/5 |

In the case that the silver paste of Table 1 was used to form the electrode, either the Sn—Bi—Ag-based or Sn—Ag-based soldering material did not cause a fill factor of a defective value. When the silver paste of Table 1 was used to form the electrode and solder of Sn was used, all of the five samples had defective FF values, as has been described in the first embodiment. In the case that the commercially available silver paste was used to form the electrode, even either the Sn—Bi—Ag-based or Sn—Ag-based solder caused all the five samples to have defective FF balues. Furthermore, when the commercially available silver paste was used to form the electrode, Sn solder caused all the five samples to have defective FF values. It can be understood from the result shown in Table 5 that when the commercially available silver paste is used to form the electrode, the solder bath of Table 3 still causes insufficient solder coating.

Third Embodiment

In a third embodiment, flux materials were compared. The electrodes were formed from the silver paste of Table 1. The flux of Table 2 and a commercially available flux (SF-60 of Sanwa Kagaku) were used for comparison. Note that the commercially available flux contains halide.

Solar cells were fabricated by a procedure similar to that described in the first embodiment. The electrodes were formed and the FF value was estimated, similarly as in the first embodiment. For each case, five samples were made.

Furthermore, as simple reliability estimation, appearance inspection was carried out after a wet endurance test (85° C., 85% RH (relative humidity), 500 h). The wet endurance test was conducted, after the solar cell coated with solder was washed and dried. If halogen or any other similar corrosive substance is insufficiently washed away, the solder and/or the silver change in color or corrosion powder is produced and thus defectiveness can readily be judged. Any solar cell found to be defective in the wet endurance test was judged to be defective in reliability. Table 6 shows the number of cells defective in fill factor and that defective in reliability.

It can be understood from Table 6 that if the Table 2 flux is used, use of the lead-free solder does not cause defective electrode-coating nor impaired reliability. It can also be understood that even if the commercially available flux is used, it is possible to coat the electrode with the lead-free solder, though the reliability of most of the cells is impaired to the level improper for practical use.

Fourth Embodiment

In a fourth embodiment, combinations of compositions of solder covering the solar cell electrode and those of solder covering the metal core line of the interconnector were evaluated in view of solderability and reliability in the solar cell string. In this embodiment, flux was not used in soldering. The results are shown in Table 7.

TABLE 7

| Composition of solder for solar cell | Composition of solder for interconnector | Solderability | Reliability in String |
|---|---|---|---|
| Sn—Bi—Ag | Sn—Bi—Ag | ○ | ○ |
| Sn—Bi—Ag | Sn—Ag | ○ | ○ |
| Sn—Ag | Sn—Bi—Ag | ○ | ○ |
| Sn—Ag | Sn—Ag | ○ | ○ |

It can be understood from Table 7 that the interconnection for forming the solar cell string can be carried out by any of the combinations and that the reliability in the form of the string is also obtained.

Fifth Embodiment

Such a solar cell of the present invention as shown in FIG. 4 was fabricated, as follows. A texture-etched p-type silicon substrate 1 having a thickness of 330 μm and an area of 125 mm by 125 mm had its light receiving side subjected to thermal diffusion of P at 900° C. to form an n-type diffusion layer 2 having a surface resistance of about 50 Ω/□ and thereon anti-reflection film 3 was formed through plasma CVD in the form of a silicon nitride film of about 60 nm

TABLE 6

|  |  |  | Flux | |
|---|---|---|---|---|
|  | Solder composition | Items of estimation | Flux of Table 2 | Commercially available flux |
| Present invention | Table 3 | No. of cells defective in FF | 0/5 | 0/5 |
|  |  | No. of cells defective in reliability | 0/5 | 4/5 |
| Conventional method | Sn alone | No. of cells defective in FF | 5/5 | 5/5 |
|  |  | No. of cells defective in reliability | — | — | thickness. Commercially available aluminum paste was screen-printed on the back surface of substrate 1 and dried at about 150° C. and then fired in the air at 700° C. to provide back surface aluminum electrode 4.

Then, silver paste was fired to provide electrodes 5, 6. More specifically, silver paste of Table 1 was printed on the substrate's back surface at a predetermined position to have a thickness of about 30 μm and it was then dried at 150° C. for about four minutes. Similarly, the silver paste was also printed in a pattern on the light receiving side of the substrate and then dried. Thereafter the silver past was fired in an oxidizing atmosphere at 600° C. for two minutes to provide the substrate's front and back surfaces with silver electrodes 5, 6.

The solar cell thus fabricated was immersed into the flux of Table 2 at a normal temperature for one minute and then exposed to hot air at 100° C. for one minute and thus dried and it was then immersed into the solder bath of Table 3 for one minute to provide solder layer 8. The solder contained a small amount of phosphorus, antimony, gallium or the like to enhance wettability. The substrate was then rinsed with pure water and hot pure water for a total of five minutes and then dried and a solar cell is thus completed.

The interconnector according to the present invention can be made for example by immersing a 2 mm wide and 0.2 mm thick copper line into a lead-free solder bath and then pull out and reeling up the copper line at a constant rate.

Figure 5:
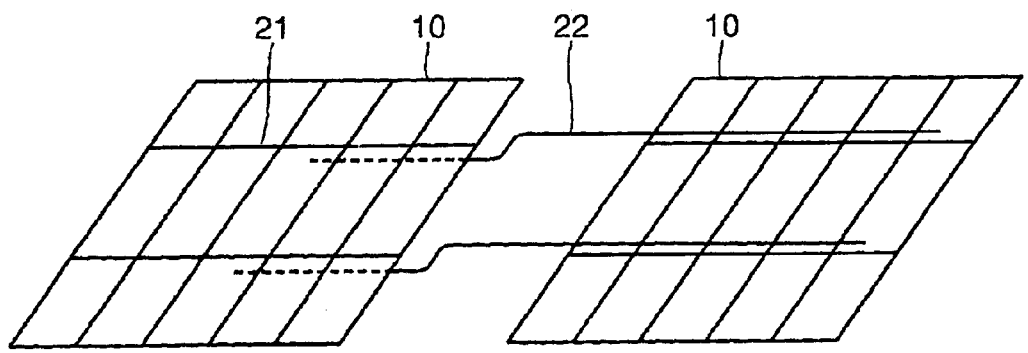
FIG. 5 is a schematic perspective view for illustrating a solar cell string of the present invention.

The solar cell string according to the present invention can be fabricated as follows. As shown in FIG. 5, an interconnector 22 cut to have a desired length is set in contact with an electrode 21 on the light receiving side of a solar cell 10. Interconnector 22 is exposed to hot air of about 400° C. to once melt the solder covering interconnctor 22 and that covering the electrode 21 and thereafter cooled and solidified to integrate the interconnector and the solar cell together. A similar process is provided for the back surface electrode of the solar cell to provide the solar cell string of the present invention.

As described above, according to the present invention, a solar cell can include an electrode coated with lead-free solder and then without causing lead pollution the solar cell can maintain satisfactory output characteristics and be highly reliable. Furthermore the present invention can provide a highly reliable solar cell string connected with interconnectors coated with lead-free solder and hence no lead pollution is caused. Furthermore the present solar cell can readily be fabricated utilizing a conventional method by simply changing soldering material.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solar cell comprising an electrode coated with lead-free solder;

wherein said electrode is formed of fired metal paste; and wherein said metal paste contains powdery silver, powdery glass, an organic vehicle, an organic solvent, phosphorous oxide, and halide.

2. The solar cell of claim 1, wherein one of metal vapor deposition, sputtering, and plating is used to coat said electrode.

3. The solar cell of claim 1, wherein said lead-free solder is one of Sn—Bi—Ag-based solder and Sn—Ag-based solder.

4. A solar cell comprising an electrode coated with lead-free solder after said electrode is cleaned with flux including resin, a solvent, and a stabilizer for said resin;

wherein said electrode is formed of fired metal paste; and wherein said metal paste contains powdery silver, powdery glass, an organic vehicle, an organic solvent, phosphorous oxide, and halide.

5. An interconnector connecting electrodes of solar cells comprising a metal core coated with lead-free solder;

wherein said electrodes are formed of fired metal paste; and wherein said metal paste contains powdery silver, powdery glass, an organic vehicle, an organic solvent, phosphorous oxide, and halide.

6. A solar cell string comprising solar cells including electrodes interconnected with interconnectors, wherein said electrodes are each coated with lead-free solder and said interconnectors are each also coated with lead-free solder;

wherein said electrodes are formed of fired metal paste; and wherein said metal paste contains powdery silver, powdery glass, an organic vehicle an organic solvent, phosphorous oxide, and halide.

7. The solar cell string of claim 6, wherein said lead-free solder used for said solar cells and said lead-free solder used for said interconnectors are identical in composition.

8. The string of claim 7, wherein Bi is contained in both said lead-free solder for said solar-cells and said lead-free solder for said interconnectors.

9. The solar cell of claim 3, wherein said lead-free solder contains 3 to 89 mass % Bi.

10. The string of claim 8, wherein said lead-free solder contains 3 to 89 mass % Bi.

11. The string of claim 6, wherein Ag is contained in at least one of said lead-free solder for said solar cells and said lead-free solder for said interconnectors.

12. The solar cell of claim 3, wherein said lead-free solder contains 3.5 to 4.5 mass % Ag.

13. The string of claim 11, wherein said lead-free solder contains 3.5 to 4.5 mass % Ag.

14. A method of forming a solar cell having an electrode, comprising the steps of:

forming said electrode, cleaning said electrode with flux including a resin, a solvent, and a stabilizer for said resin, and coating said cleaned electrode with lead-free solder.

* * * * *